United States Patent [19]
Razeghi

[11] Patent Number: 5,663,976
[45] Date of Patent: Sep. 2, 1997

[54] BURIED-RIDGE LASER DEVICE

[75] Inventor: Manijeh Razeghi, Wilmette, Ill.

[73] Assignee: Northwestern University, Evanston, Ill.

[21] Appl. No.: 543,779

[22] Filed: Oct. 16, 1995

[51] Int. Cl.$^6$ ............................................. H01S 3/19
[52] U.S. Cl. ..................................... 372/46; 372/45
[58] Field of Search ............................ 372/46, 45

[56] References Cited

U.S. PATENT DOCUMENTS

| | | | |
|---|---|---|---|
| 5,212,704 | 5/1993 | Chen et al. | 372/46 |
| 5,321,712 | 6/1994 | Itaya et al. | 372/46 |

OTHER PUBLICATIONS

Diaz et al., IEEE Photon. Technol. Lett. PTL–6, 132 (1994), Feb.
Mobarhan et al., J. Appl. Phys. 72, 4447 (1993), Nov. 1.
Garbuzov et al., IEEE J. Quantum Electron. QE–27, 1531 (1991), Jun. 6.
He et al., J. Appl. Phys. 62, 618 (1993) Feb. 8.
M. Razeghi, *The MOCVD Challenge*, vol. 1; A survey of GaInAsP–InP–InP for photonic and electronic applications, 4.3.2 Buried–ridge–structure lasers grown by MOCVD, pp. 215–233, (1989) (No month).

M. Razeghi, *The MOCVD Challenge*, vol. 1: A survey of GaInAsP–InP for photonic and electronic applications, 6.5.3 CW operation f a $Ga_{0.25}In_{0.75}As_{0.5}P_{0.5}$BRS laser on silicon substrate, pp. 311–313 (1989) (No month).

J. Diaz et al, "Investigation of 0.8 μm InGaAsp–GaAs Laser diodes with Multiple Quantum Wells", Optoelectronic Integrated Circuit Materials, Physics and Devices, vol. 2397, pp. 350–362 Feb. 6–9, 1995.

J. Diaz et al, "Optimization of InGaAsP/GaAs laser diode processing for high power operation" Center for Quantum Devices, Dept. of Elect. Eng. and Computer Science, Northwestern Univ. Date none.

*Primary Examiner*—James W. Davie
*Attorney, Agent, or Firm*—Welsh & Katz, Ltd.

[57] ABSTRACT

A buried-ridge structure of the quaternary/tertiary structures of $In_xGa_{1-x}As_yP_{1-y}$/InGaP (x and y<1) are grown on a GaAs substrate by Low Pressure Metalorganic Chemical Vapor Deposition (LP-MOCVD) in a two-step process. The process comprises steps of growing and doping the requisite epitaxial layers, etching these layers so that stripes or mesas of material remain and then regrowing the material by gas molecular beam epitaxy (GSMBE). The structures are then processed into devices.

9 Claims, 3 Drawing Sheets

BURIED-RIDGE LASER DEVICE

This invention is made with government support under Grant DAA H4-93-G-0044 awarded by the ARPA/United States Army. The government has certain rights in the invention.

FIELD OF THE INVENTION

This invention relates to semiconductor III-V alloy compounds, and more particularly to a method of making III-V alloy compounds for use in diode lasers.

BACKGROUND OF THE INVENTION

The importance of semiconductor lasers is rapidly increasing along with progress in the opto-electronic field, such as optical fiber communication, optical data processing, storage and solid state laser pumping. High power 808 nm laser diodes for Nd:YAG laser pumping and other universal laser devices appears to be the future generation of blue and other visible light lasers in information processing and fiber optic telecommunications.

Buried-ridge lasers have the advantages of providing excellent optical and electrical confinement for carriers. In addition, these lasers provide low threshold current density, stable guide modes, and near-circular far-field pattern. In particular, such structures can couple the laser light output efficiently into an optical fiber. The internal waveguide can be formed by etching the semiconductor material and regrowing a lower index material around the lasing stripe.

The technique of LP-MOCVD is well adapted to the growth of the entire composition range of GaInAsP layers of uniform thickness and composition that is lattice matched to GaAs over areas of more than 10 cm$^2$. This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases. In contrast to LPE growth, it has been found that during MOCVD growth of a double heterostructure, GaAs can be grown directly on GaInAsP with no disturbance of the active layer, i.e., there is no effect equivalent to melt-back.

One of the key reasons for the usefulness of the MOCVD method is the possibility of obtaining high-purity and therefore high-mobility $Ga_xIn_{1-x}As_yP_{1-y}$ heterostructures. As long-wavelength 1.0–1.65 µm GaInAsP electro-optical devices become more widely used, motivated by low fiber absorption and dispersion, high transmission through water and smoke, and greatly enhanced eye safety at wavelengths greater than 1.4 µm, LP-MOCVD offers the advantages of smooth uniform surfaces, sharp interfaces (lower than 5 Å for GaInAsP/GaAs), uniformly lower background doping density, and economy of scale for large-area devices.

Recent studies have shown the feasibility of using InGaAsP/GaAs heterostructures as diode lasers. The diodes can be used successfully for solid state laser pumping and can be interchanged with lasers based on AlGaAs/GaAs heterostructures.

Laser diodes emitting at 808 n wavelength are important sources for the pumping of YAG:Nd lasers. AlGaAs/GaAs lasers are commonly used for this purpose, but there are several problems with these structures: oxidation of AlGaAs layers which makes further regrowth and device fabrication difficult; higher growth temperature which may not be compatible with monolithic integration; and the presence of dark line defects and dislocation migration which can cause degradation in performance. Most of these problems can be attributed to the presence of Aluminum. High-power quantum well lasers based on liquid phase epitaxy (LPE) grown GaInAsP/GaAs structures do demonstrate characteristics competitive to the best existing AlGaAs/GaAs separate confinement heterostructure-single quantum well (SCH-SQW) lasers, but, as stated above, growth by LPE presents several major disadvantages.

SUMMARY OF THE INVENTION

Thus, an object of the subject invention is an aluminum-free buried-ridge structure (BRS) laser emitting at 808 nm–908 nm.

A further object of the subject invention is a BRS laser of the structure InGaAsP/GaAs.

These and other objects of the subject invention are attained whereby a buried-ridge structure of the quaternary/tertiary structures of $In_xGa_{1-x}As_yP_{1-y}$/InGaP (x and y<1) are grown on a GaAs substrate by Low Pressure Metalorganic Chemical Vapor Deposition (LP-MOCVD) in a two-step process. The process comprises steps of growing and doping the requisite epitaxial layers, etching these layers so that stripes or mesas of material remain and then regrowing the material by gas molecular beam epitaxy (GSMBE). The structures are then processed into devices.

DETAILED DESCRIPTION OF ONE EMBODIMENT OF THE INVENTION

Figure 1:
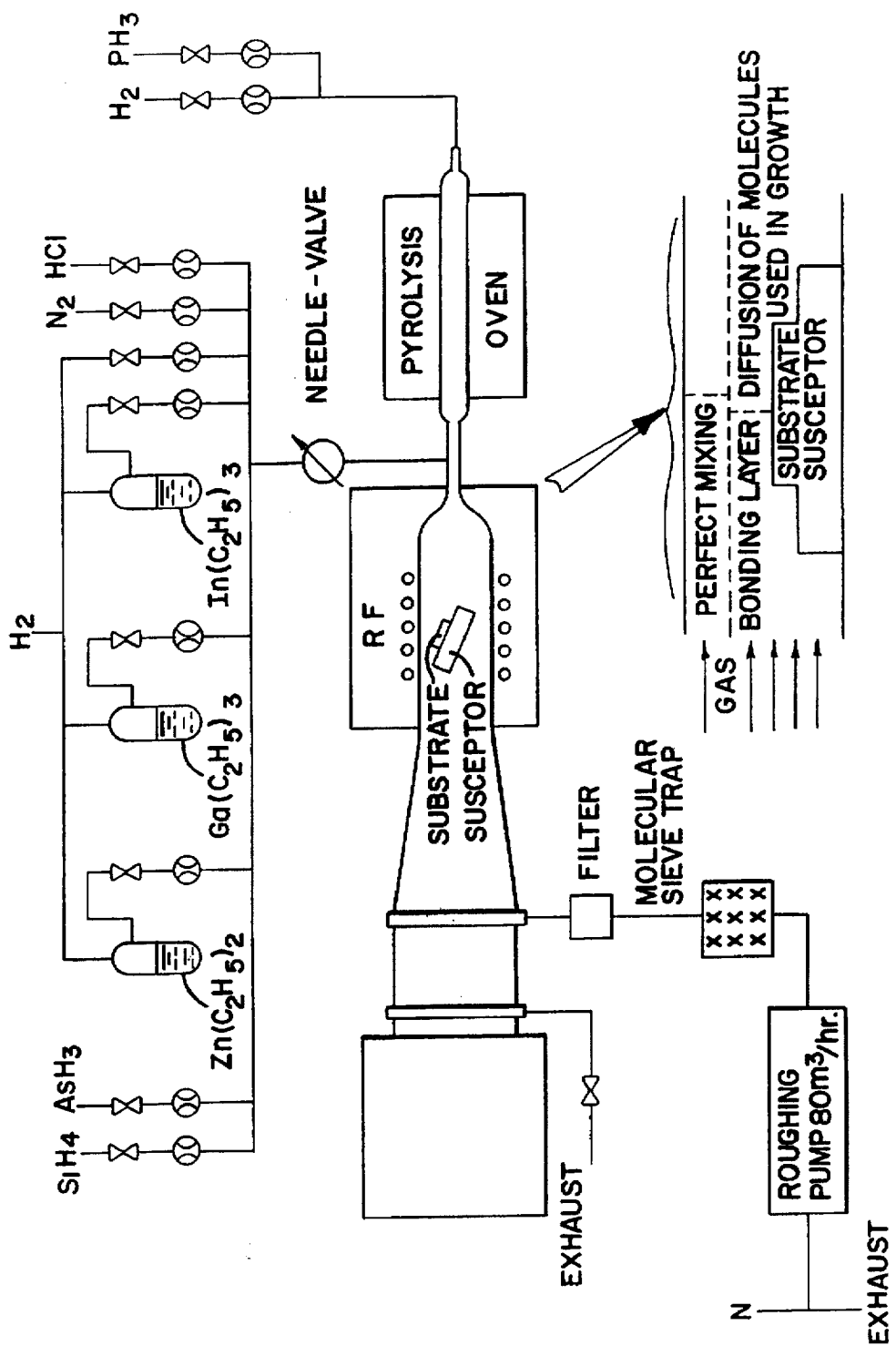
FIG. 1 is a schematic diagram of the LP-MOCVD reactor for use in growing the device of the subject invention.

The reactor and associated gas-distribution scheme used herein are shown in FIG. 1. The system consists of a cooled quartz reaction tube (diameter 5 cm in the substrate area) pumped by a high-capacity roughing pump to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a nitrogen flow of 4 liters min$^{-1}$, and the working pressure of 75 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas source used in this study for the growth of GaInAsP by LP-MOCVD are listed in the accompanying tabulation. The organometallic

| Group-III Sources | Group-V Sources |
| --- | --- |
| Ga $(C_2H_5)_3$ | $AsH_3$ |
| In $(CH_3)_3$ | $PH_3$ | group-III species of trimethyl indium (TMI) and triethyl gallium (TEG) are contained in stainless steel bubblers, which are held in controlled temperature baths at 31° and 0° C., respectively. An accurately metered flow of purified $H_2$ for TMI and TEG is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted arsine ($AsH_3$) and pure phosphine ($PH_3$) are used as sources of As and P, respectively. The metal alkyl of hydride flow can be either injected into the reactor or into the waste line by using two-way valves. In each case, the source flow is first switched into the waste line to establish the flow rate and then switched into the reactor. The total gas flow rate is 8 liters min$^{-1}$. Stable flows are achieved by the use of mass flow controllers.

Semi-insulating or n+ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 µm from each side. The wafers were then mechanochemically polished in a solution of 1.5% bromine in methanol, removing a further 80–100 µm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n$^+$ tin-doped substrate was generally used for each experiment.

The epitaxial layer quality is sensitive to the pretreatment of the substrate and the alloy composition.

Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rising in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 500° and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

Figure 3:
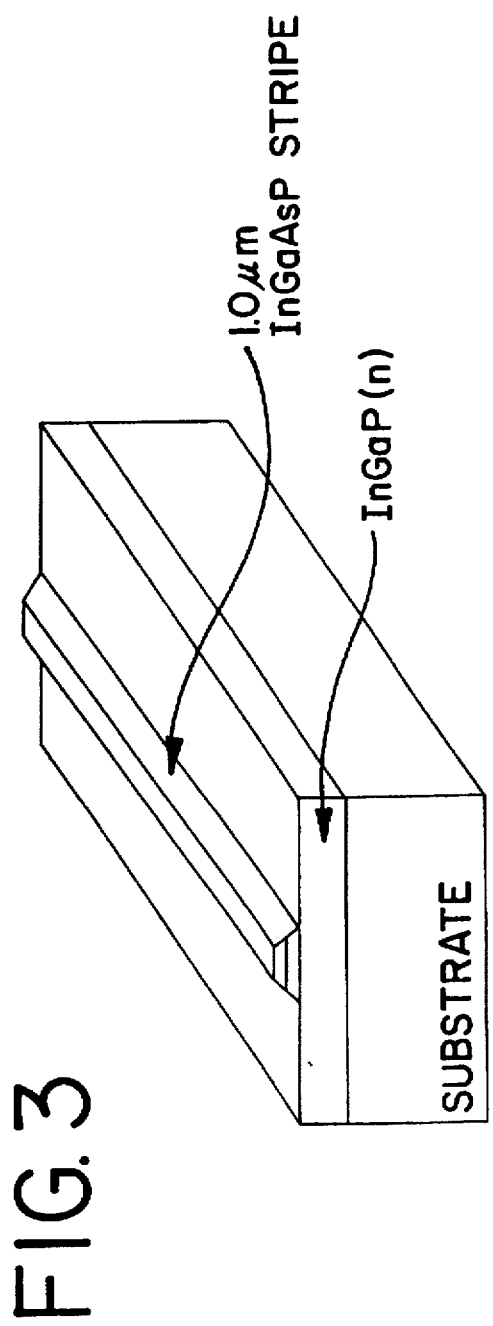
FIG. 3 is a plot of the compositional plan of a partially grown BPS device of the subject invention after etching.
Figure 4:
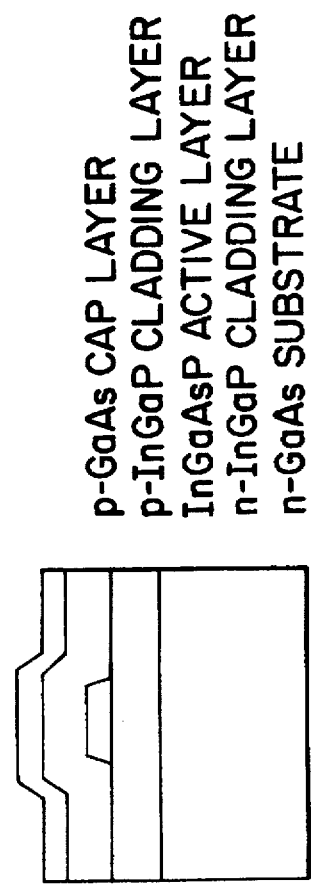
FIG. 4 is a cross-sectional view of the compositional plan of the BRS device of FIG. 2.

The growth of buried-ridge structures by low-pressure metallorganic chemical vapor deposition according to the subject The growth of buried-ridge structures by low-pressure metallorganic chemical vapor deposition according to the subject invention comprises a two-step process. The first growth comprises growing a layer about 1.0 µm-thick n-doped GaInP on an n-doped GaAs substrate, all at temperatures from 500° C.–600° C., followed by about a 300 Å thick undoped GaInAsP quaternary active layer sandwich between two about 0.2 µm-thick undoped GaInAsP waveguide layers which have a stiochiometry different from the active layer. Next, a stripe of about 1.0–1.1 µm width and 0.4 µm depth is etched in the GaInAsP layer through a photolithographic resist mask, using an appropriate etching solution to result in a structure as shown in FIG. 3. The etched mesas undergoes a stripping process to completely remove the resist layer on top of the 1.0 µm mesa. The resist removal is followed by a $H_2SO_4$ etch step to remove processing damage. Once the etched mesa have been fabricated, about 1.0 µm-thick p-type doped GaInP and about 0.1 µm-thick p-type doped GaAs layer are regrown at 550° C. over the entire etched mesas. The result is as shown in FIG. 4.

Figure 2:
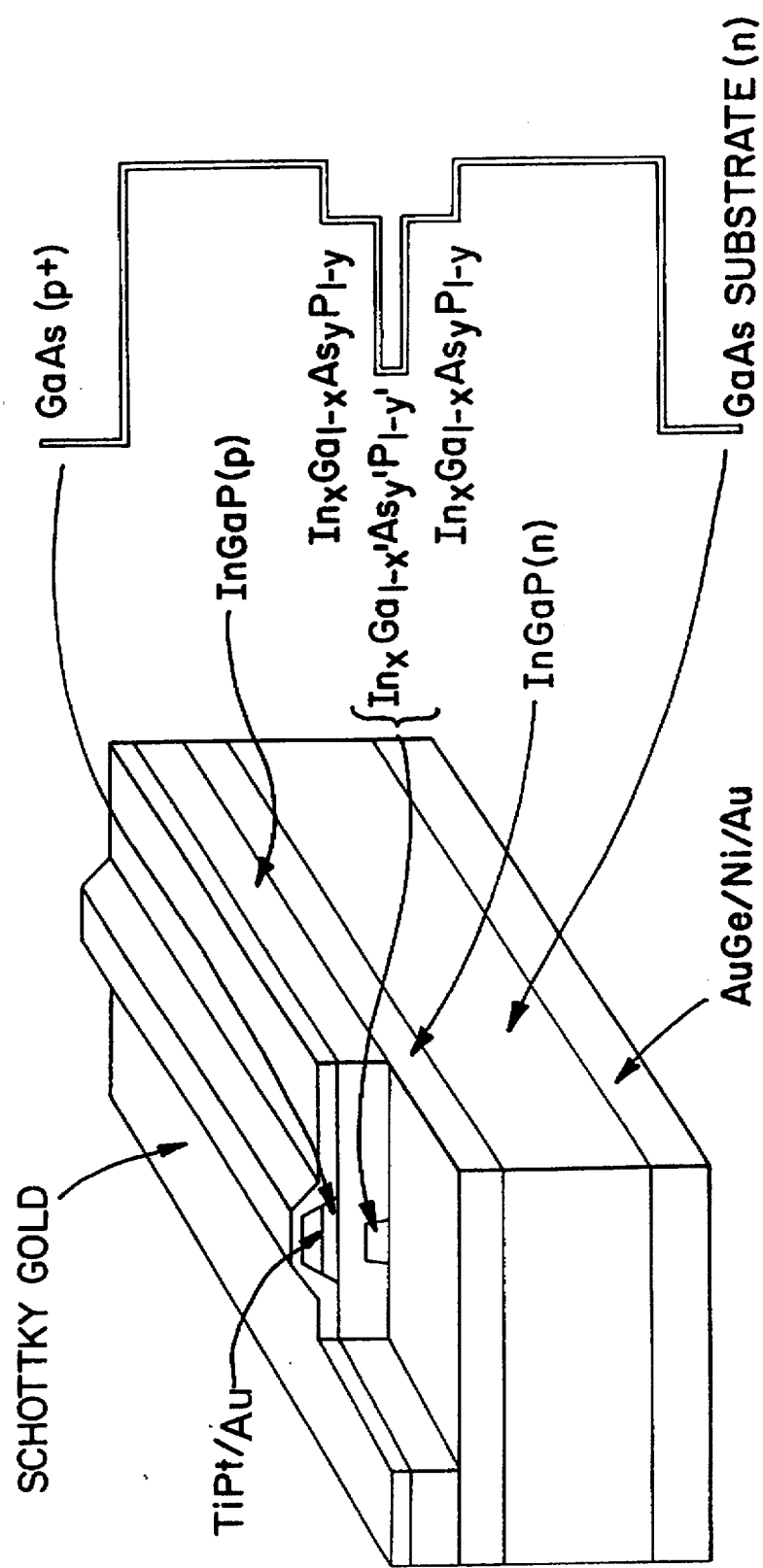
FIG. 2 is a plot of the compositional phase of the BRS device of the subject invention

After regrowth of the upper GaInP cladding and GaAs cap layer using GSMBE growth technique, the laser structures are then processed into devices such as shown in FIG. 2.

High quality GaInAsP/GaAs may be grown in the method of the subject invention by low pressure metallorganic chemical vapor deposition (LP-MOCVD). The layers of the heterostructure are grown by the induction-heated horizontal cool wall reactor of FIG. 1, as described below in more detail. Sample is grown on a (001) GaAs substrate with 2 degree misorientation toward <110>, thus giving rise to a strained layer quantum well. The optimum growth conditions are listed in Table 1. Doping is preferably conducted with diethyl zinc (DEZ) for p-type doping and silane ($SiH_4$) for n-type doping. However, for n-type doping, Be (Dimethyl Beryllium) or Mg ($Cp_2Mg$) may be used as p-type dopants. Ash-type dopants, Sulfer ($SH_2$) is also acceptable. Doping is performed through the DEZ bubbler shown in FIG. 1 with $H_2$ as carrier gas and at temperatures from −15° C. to ambient temperatures at 20–90 cm$^3$min.$^{-1}$ and onto either a hot or cooled substrate (535° C.). $SiH_4$ or $H_2S$ may be simply directed at ambient temperatures onto the hot substrate at 20–90 cm$^3$ min.$^{-1}$.

The GaAs layers can be grown at 76 Torr and low temperature, between 500° and 600° C., by using TEG and arsine ($AsH_3$) in a $H_2$ or $N_2$ or $H_2+N_2$ carrier gas.

Layers of InGaP can be grown at 76 Torr and low temperature between 500° and 600° C., by using TEI or TMI, TEG, and ($PH_3$) in an $H_2$ or $N_2$ or $H_2+N_2$ carrier gas. Uniform composition InGaP over an area of 10 cm$^2$ of GaAs substrate has been obtained. GaAs-InGaP interfaces can be obtained by turning off the arsine flow and turning on both the TMI and the PH$_3$. InGaP-GaAs interfaces can be obtained by turning off the PH$_3$ and TMI flow and turning on the AsH$_3$ flow. The growth rate is small (5, Å sec$^{-1}$), and it takes less than 1 second for a gas flow to reach its new steady state.

The growth of buried-ridge structures by low-pressure metallorganic chemical vapor deposition according to the subject invention is as follows. The first growth comprises growing a layer 1.0 μm-thick Si-doped (Nd~5×10$^{17}$ cm$^{-3}$) GaInP on an n-type Si-doped GaAs substrate all at 550° C., followed by a 300 Å μm-thick undoped Ga$_{0.87}$In$_{0.13}$As$_{0.74}$P$_{0.26}$ quaternary active (Eg=1.495±0.005 m eV) layer sandwich between two 0.2 μm-thick undoped Ga$_{0.63}$In$_{0.37}$As$_{0.25}$P$_{0.75}$ waveguide layers (Eg=1.78±0.01 eV). Next, a stripe of 1.09 μm width and 0.4 μm depth is etched in the GaInAsP layer through a photolithographic resist mask, using H$_2$O$_2$:HCl:HBr:H$_2$O (1:5:10:50) for 40 seconds at room temperature. The etched mesas undergoes a stripping process (using AZ 400K stripper solution) to completely remove the resist layer on top of the 1.0 μm mesas. The resist removal is followed by a one minute H$_2$SO$_4$ etch step at room temperature to remove processing damage. Once the etched mesa have been fabricated, the samples are returned to the reactor to use gas molecular beam epitaxy (GSMBE) technique. A 1.0 μm-thick Zn doped (N$_a$~6×10$^{17}$ cm$^{-3}$) GaInP layer and a 0.09 μm-thick Zn doped GaAs (1×10$^{20}$ cm$^{-3}$) layer are regrown at 550° C. over the entire etched mesas.

After regrowth of the upper GaInP cladding and GaAs cap layer using GSMBE growth technique, the laser structures are then processed into devices. The surface cleaning of these wafers consists of a chemical degreasing of trichloroethane (to remove wax and grease residues), acetone (to remove polymer particles), methanol and propanol (to remove particles from previous steps or water content) for 5 minutes each. The wafers are then immersed into a 1% hydrofluoric (HF) solution for 20 seconds to remove any interfacial native oxides from the semiconductor surface prior to metal deposition. In order to localize the injection current through the active region, a 5 μm resist mask is properly aligned over the regrowth 1.0 μm active region. The strip contact is formed by the combination of metallization technology (i.e., lift-off technique) and photolithographic techniques.

The 5 μm wide metal contact to a p$^+$-type doped GaAs layer is formed by selectively choosing the appropriate metallization system. The metallization system used for GaInP/GaInAsP/GaAs material is Ti-Pt-Au. There follows an overlay period of 15 minutes between each evaporation. The evaporation rate required to deposit these multilayer metal films is 10–20 Å per minute. The removal of the Ti-Pt-Au between the 100 μm stripes consists of universal lift-off techniques. The lift-off procedure consists of placing the wafers into an acetone bath for an amount of time necessary to completely remove the metal film between the stripes.

In order to confine the current along the 5 μm strip contact, chemical wet etching is applied to the laser processing. In general, the etching procedure should be uniform across the wafer, consistent and reproducible from wafer to wafer. With the upper GaInP layer serving as an etch stop, the p$^+$-type GaAs cap layer between the 5 μm stripe contacts is selectively etched using NH$_4$OH:H$_2$O$_2$:H$_2$O (Ammonia Hydroxide:Hydrogen Peroxide) mixture at pH level of 7 or H$_2$SO$_4$:H$_2$O$_2$:H$_2$O (3:1:1). The use of this selective etch solution provides tight tolerances of mask undercutting (±0.02 μm) and uniform etch walls across the wafer. This is one additional advantage of using the GaInP/GaInAsP/GaAs material system.

The non-alloying heat treatment for the Ti-Pt-Ay contacts to the p$^+$-GaAs layer is accomplished by a heat treatment of 440° C.±20° C. for approximately 3 minutes in a controllable forming gas ambient of 10% H$_2$ in N$_2$. The system used to obtain the metallurgical composition of the metal layer to p$^+$-doped GaAs layer is done by open tube furnace rather than rapid thermal annealing. The next sequence is the lapping/polishing of the n$^+$-GaAs layer to a thickness of 100 μm. the primary factor in lapping/polishing the n-GaAs substrate is generally 400 μm to 500 μm-thick. The procedure used to facilitate this material for the preparation of lapping/polishing comprises applying a protective layer of photoresist onto the p$^+$-GaAs contact layer to prevent any type of buildup contamination that occurs during this stage of processing. The wafers are bonded p-side down onto a glass substrate (83 mm diameter×6 mm nominal thickness) by an excess of wax. the glass substrate along with the bonded wafers are mounted onto a commercialized Logitech lapping/polishing machine that polishes the wafers to a thickness of 100 μm. The final stages of laser fabrication is the metallization used for n-type, GaAs substrate consists of gold germanium (AuGe:700 Å±10 Å;nickel (Ni):350 Å±20 Å; gold (Au):2000 Å±100 Å metallization. The alloying procedure to obtain the eutectic composition of AuGe-Ni-Au to the n-type GaAs layer is carried out in a flowing 10% H$_2$-N$_2$ ambient at 400° C.±10° C. for two minutes in an open tube furnace. A final layer of Schottky Au (1000 Å) is deposited over the entire p$^+$-contact surface in order to form a current-blocking Schottky barrier outside the 5 μm stripes and to permit cleaved laser chips to be bonded p-side down on indium-coated copper heatsinks.

The GaInAsP/GaInP/GaAs buried-ridge lasers grown as set forth above have displayed 5 mW output power (without an antireflective coating) at a cavity length of 400 μm under pulse operation (400 ns—repetition rate 1.25 kHz). These devices have exhibited single lateral mode under room temperature at 820 nm wavelength.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. A buried-ridge structure consisting essentially of an Al-free heterostructure, said heterostructure comprising a lower cladding layer of an n$^+$ doped InGaP layer on an n$^+$ doped GaAs substrate;

an undoped active layer of In$_x$Ga$_{1-x}$As$_y$P$_{1-y}$(X<1, Y<1) adjacent said lower cladding, an upper cladding layer of a p-doped InGaP layer adjacent said active layer; and a cap layer of p$^+$ doped GaAs;

said active layer comprising a mesa surrounded on three sides by said upper cladding layer and on a fourth side by said lower cladding layer.

2. The buried-ridge structure of claim 1 wherein said active layer comprises an active layer between two waveguide layers, said active layer being stoichiometrically different from said waveguide layers.

3. The buried-ridge structure of claim 1 wherein said upper and lower cladding layers are each about 1.0 μm thick.

4. The buried-ridge structure of claim 1 wherein said active layer is about 0.4–0.5 μm thick.

5. The buried-ridge structure of claim 1 wherein said active layer comprises a raised stripe of about 1.0 μm width and 0.4 μm depth.

6. The buried-ridge structure of claim 2 wherein said third is 1.0 μm thick.

7. A buried-ridge structure formed by low pressure metallorganic chemical vapor deposition comprising a heterostructure on a silicon doped GaAs substrate and having first layer of Si doped GaInP adjacent said substrate;

a second layer adjacent said first layer including an undoped $Ga_{0.87}In_{0.13}As_{0.74}P_{0.26}$ layer between two undoped $Ga_{0.63}In_{0.37}A_{0.25}P_{0.75}$ layers;

a third layer adjacent said second layer of second doped InGaAs and second doped GaAs, where said second layer comprises a mesa surrounded by said first layer and said third layer.

8. The buried-ridge structure of claim 7 wherein said first layer is 1.0 μm thick.

9. The buried-ridge structure of claim 7 wherein said second layer is about 0.4–0.5 μm thick.

* * * * *